United States Patent [19]

Glance

[11] Patent Number: 5,264,960
[45] Date of Patent: Nov. 23, 1993

[54] OPTICAL WAVELENGTH SHIFTER

[75] Inventor: Bernard Glance, Colts Neck, N.J.

[73] Assignee: AT&T Bell Laboratories, Murray Hill, N.J.

[21] Appl. No.: 880,728

[22] Filed: May 8, 1992

[51] Int. Cl.[5] .......................... G02F 1/35; H01S 3/10
[52] U.S. Cl. .................................... 359/344; 359/237
[58] Field of Search ............... 359/237, 344, 336, 326, 359/327

[56] References Cited

U.S. PATENT DOCUMENTS

| | | | |
|---|---|---|---|
| 4,822,992 | 4/1989 | Bar-Joseph et al. | 250/211 J |
| 4,879,761 | 11/1989 | Webb | 455/601 |
| 5,111,333 | 5/1992 | Coles et al. | 359/344 |

OTHER PUBLICATIONS

H. Rokugawa et al., "Error-Free Operation of Wavelength Conversion Laser for Multistage Photonic Cross-Connect Node," Elec. Letters, vol. 24, No. 17, pp. 393-395, Feb. 1991.

G. Grosskopf et al., "140 mbit/s DPSK Transmission Using An All-Optical Frequency Convertor With A 4000 Ghz Conversion Range," Electronics Letters, vol. 24, No. 17, Aug. 18, 1988, pp. 1106-1107.

P. E. Barnsley et al., "All-Optical Wavelength Switching from 1.3 $\mu$m to a 1.55 $\mu$m WDM Wavelength Routed Network: System Results," IEEE Photonics Tech. Letters, vol. 4, No. 1, Jan. 1991, pp. 91-94.

P. E. Barnsley et al., "Wavelength Conversion from 1.3 to 1.55 $\mu$m Using Split Contact Optical Amplifiers," IEEE Photonics Tech. Letters, vol. 3, No. 3, Mar. 1991, pp. 256-258.

G. Eisenstein, "Semiconductor Optical Amplifiers," IEEE Circuits and Devices Magazine, Jul. 1989, pp. 25-30.

K. Inoue, "High-Speed All-Optical Gate Switching Experiment In A Fabry-Perot Semiconductor Laser Amplifier," Elec. Letters, vol. 23, pp. 911-912, Jul. 1987.

Durhuus et al., "High-Speed All-Optical Gating Using a Two-Section Semiconductor Optical Amplifier Structure," Conf. on Lasers and Electro-Optics, Anaheim, Calif., May 1992, Paper CThS4.

Primary Examiner—Ian J. Lobo
Attorney, Agent, or Firm—Gerard A. De Blasi

[57] ABSTRACT

High bit rate optical wavelength shifters that are fully tunable within a bandwidth of interest are realized using a traveling wave semiconductor optical amplifier that impresses a representation of data modulated on an optical signal at a first wavelength onto an optical signal of weaker signal strength at a second, desired wavelength. The data representation is impressed on the second optical signal through use of the gain-saturation effect that occurs in the traveling wave semiconductor optical amplifier. The traveling wave (single pass) amplifier receives simultaneously the modulated optical signal at the first wavelength and the second optical signal at the desired wavelength. The first optical signal affects the gain of the traveling wave amplifier as seen by the second optical signal so as to impress a representation of variations in the envelope of the first optical signal onto the second optical signal.

22 Claims, 6 Drawing Sheets

OPTICAL WAVELENGTH SHIFTER

This invention relates to optical devices. More particularly, this invention relates to optical devices for impressing a representation of data from an optical signal at a first wavelength onto an optical signal at a second wavelength.

BACKGROUND OF THE INVENTION

Optical signals can be routed within optical networks on the basis of the wavelength of those optical signals using wavelength division multiplexing (WDM) and frequency routing techniques. The capacity of an optical network based on such routing techniques is limited, however, by the tuning bandwidth of the lasers in the optical network. The problem of limited capacity can be overcome, and greater system design flexibility achieved, by providing the ability to change the wavelength of a given optical data signal.

Optical devices known as "wavelength shifters" or "wavelength converters" change the wavelength of an optical data signal. Such devices typically operate to transfer data from an optical signal at a first wavelength to an optical signal at a second, desired wavelength.

Prior wavelength shifters performed electro-optical conversions to shift the wavelength of an optical data signal. More specifically, these wavelength shifters converted an optical data signal at a first wavelength into an electrical data signal, then reconverted the electrical signal to an optical signal at the desired wavelength. Such wavelength shifters, however, required complex control circuitry to perform the necessary optical/electrical conversions. Other wavelength shifters utilized Fabry-Perot (multi-pass) amplifiers to transfer data from an optical signal at a first wavelength to an optical signal at a second, desired wavelength. However, Fabry-Perot devices are relatively slow, provide a low contrast ratio between the input and output optical signals, and are not fully tunable within the bandwidth of interest.

SUMMARY OF THE INVENTION

High bit rate optical wavelength shifters that are fully tunable within a bandwidth of interest are realized using a traveling wave semiconductor optical amplifier that impresses a representation of data modulated on an optical signal at a first wavelength onto an optical signal at a second, desired wavelength. The data representation is impressed on the second optical signal through use of the gain-saturation effect that occurs in the traveling wave semiconductor optical amplifier. The traveling wave (single pass) amplifier receives simultaneously the modulated optical signal at the first wavelength and the second optical signal at the desired wavelength. The first optical signal to affects the gain of the traveling wave amplifier as seen by the second optical signal so as to impress a representation of variations in the envelope of the first optical signal onto the second optical signal.

In an illustrative embodiment, the first and second optical signals are coupled by an optical coupler and co-propagate through the traveling wave semiconductor optical amplifier. Variations in the envelope of the first optical signal, such as data modulated onto the first optical signal, are impressed onto the envelope of the second optical signal as the second optical signal is amplified. The first and second optical signals are output from the device as amplified signals. The second optical signal is then extracted from the signals output from the traveling wave semiconductor optical amplifier to provide a data signal at the desired wavelength.

DETAILED DESCRIPTION

Figure 1:
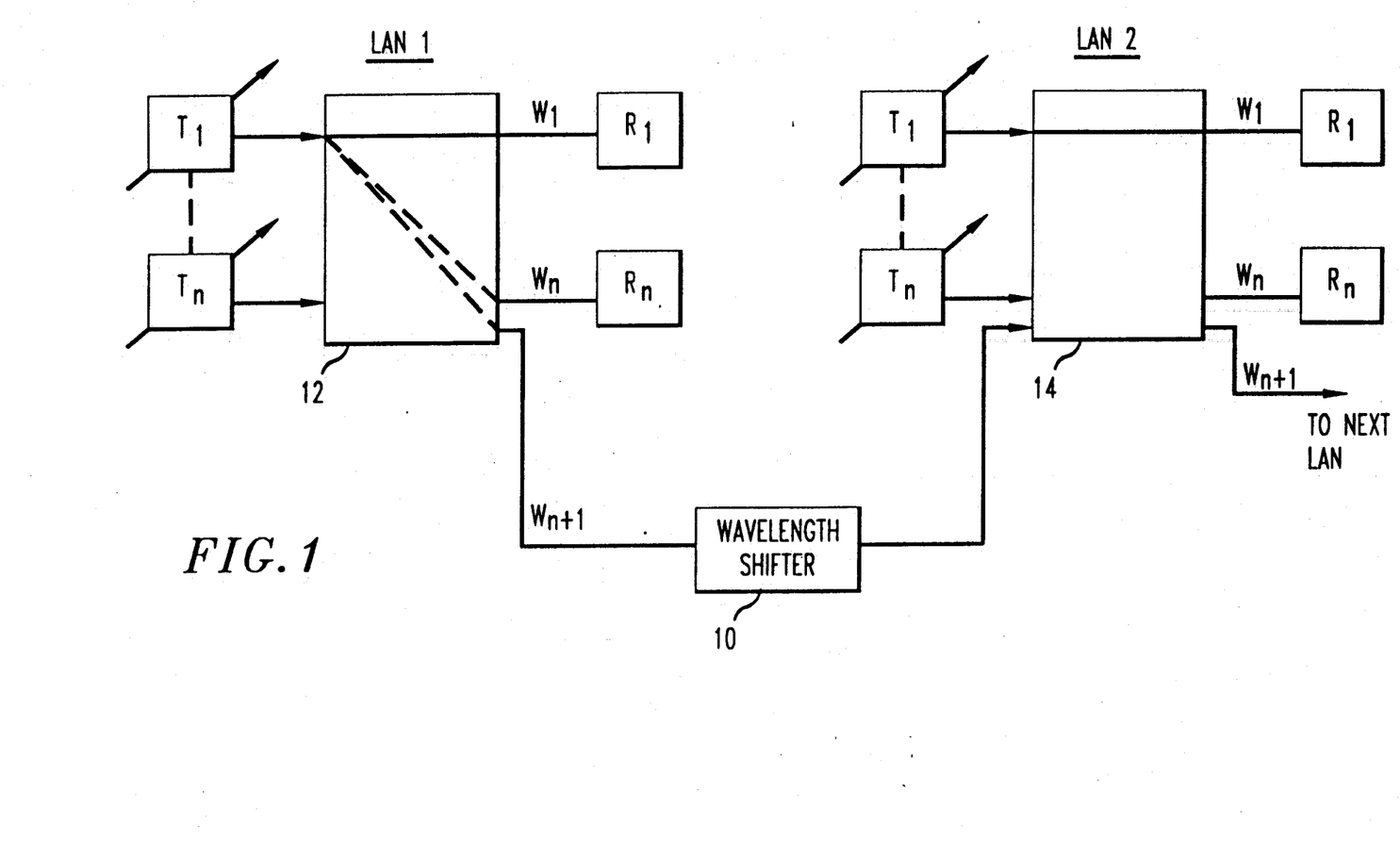
FIG. 1 is a block diagram of a WDM circuit that utilizes a wavelength shifter to interconnect two optical local area networks to construct a larger optical network.

With reference to the drawings, FIG. 1 shows an exemplary use of a wavelength shifter 10 for increasing the capacity of optical networks in which optical signals are routed on the basis of wavelength. Wavelength shifter 10 permits a large local area network (LAN) to be constructed by interconnecting two smaller local area networks LAN 1 and LAN 2.

Within each of LANs 1 and 2, optical signals are routed between transmitters $T_1$ through $T_n$ and receivers $R_1$ through $R_n$ by tuning a predetermined transmitter to the receiving wavelength of a selected receiver. More particularly, transmitters $T_1$ through $T_n$ include lasers that are tunable within a predetermined wavelength band. A transmitter addresses one of receivers $R_1$ through $R_n$ by outputting a signal having a wavelength that equals the receiving wavelength of the selected receiver. For example within LAN 1, transmitter $T_1$ addresses receiver $R_1$ by outputting through optical demultiplexer 12 an optical signal of wavelength $W_1$. Similarly, transmitter $T_1$ addresses receiver $R_1$ by outputting an optical signal of wavelength $W_n$. LANs 1 and 2 use the same set of wavelengths for local routing. The size of each LAN is limited by the tuning bandwidth of its respective transmitters.

Wavelength shifter 10 overcomes the size limitation imposed by the tuning bandwidth of the transmitters on each LAN by reassigning the wavelengths of the signals flowing between LANs to effectively "re-use" the transmitter tuning bandwidth. More specifically, a transmitter in LAN 1 can transmit to a receiver in LAN 2 via wavelength shifter 10 by outputting an optical signal at wavelength $W_{n+1}$ that causes optical demultiplexer 12 to address wavelength shifter 10. Wavelength shifter 10 then "shifts" the data to an optical signal having a wavelength that matches the receiving wavelength of the selected receiver in LAN 2. For example, transmitter $T_1$ of LAN 1 transmits to receiver $R_1$ of LAN 2 by outputting a data signal at wavelength $W_{n+1}$ to address wavelength shifter 10. Wavelength shifter 10, in turn, changes the wavelength of the data signal to $W_1$ to address receiver $R_1$ of LAN 2 via demultiplexer 14. Wavelength shifter 10 is controlled, for example, in response to addressing information included in the data signal.

One skilled in the art will appreciate from the example of FIG. 1 that it is desirable for wavelength shifter 10 to have a high bandwidth to accommodate the full tuning bandwidth of transmitters $T_1-T_n$. Wavelength shifter 10 also preferably operates at a high bit rate so as to limit the bit rate of the network. Wavelength shifter 10 preferably provides gain to the optical data signal, and does not significantly degrade the optical data signal, so that several wavelength shifters and LANs can be cascaded without data loss.

Figure 2:
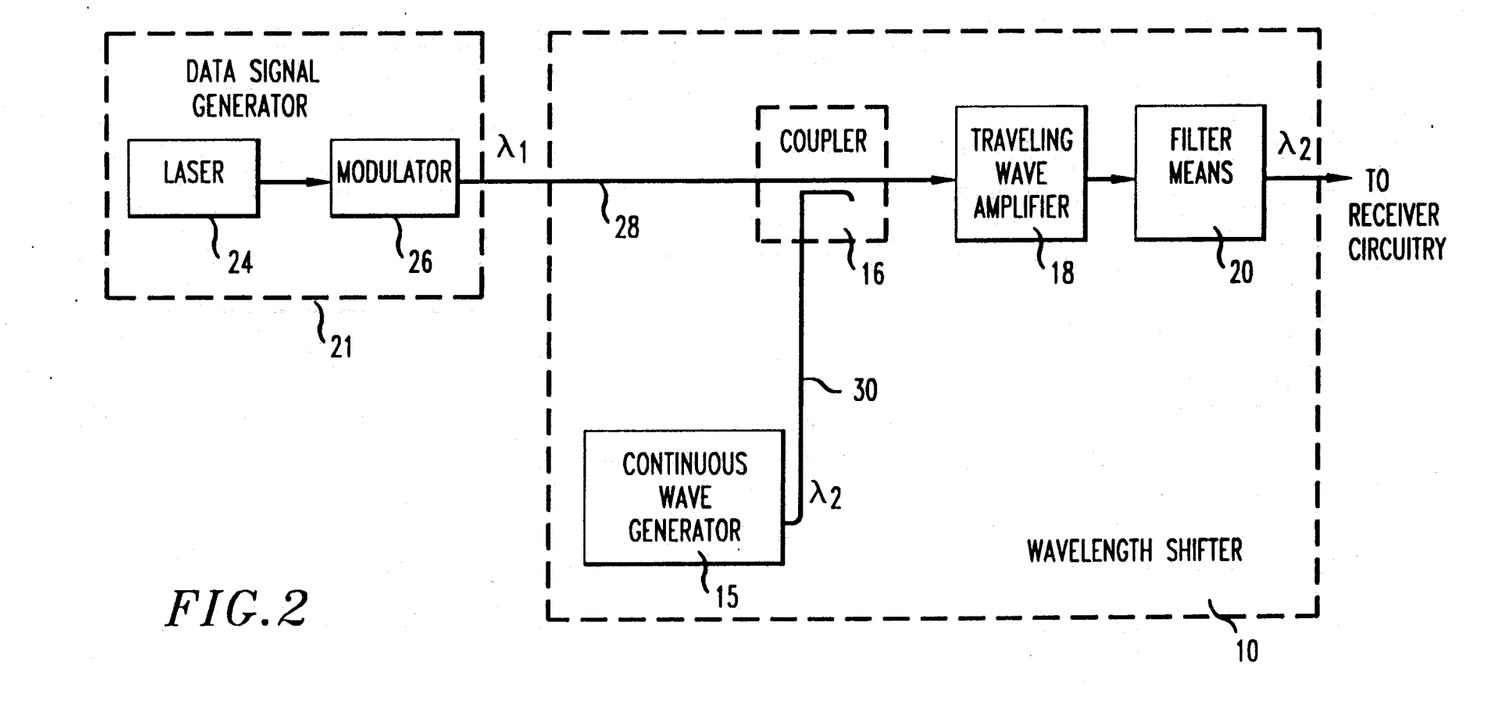
FIG. 2 is a block diagram of a wavelength shifter realized in accordance with the principles of the present invention.

FIG. 2 shows an illustrative embodiment of wavelength shifter 10 realized in accordance with the principles of the present invention. Wavelength shifter 10 includes a continuous wave generator 15, an optical coupler 16, a traveling wave amplifier 18, and a filter means 20, all of which can be integrated on a single device. Optical isolators (not shown) typically are provided to isolate traveling wave amplifier 18 from the other components of the wavelength shifter. Wavelength shifter 10 is coupled to receive optical data signals from a data signal generator 21.

As described in greater detail below, optical coupler 16 combines an optical data signal received from data signal generator 21 with a continuous wave signal output from continuous wave generator 15. The combined signal is amplified by traveling wave amplifier 18. Within traveling wave amplifier 18, the data signal affects the gain of the traveling wave amplifier as seen by the continuous wave signal so as to impress a representation of variations in the envelope of the data signal onto the continuous wave signal as the continuous wave signal is being amplified. Filter means 20 then extracts the new data signal at the desired wavelength from the output of traveling wave amplifier 18 and provides the new data signal to receiver circuitry (not shown).

Data signal generator 21 illustratively includes a laser 24 and a modulator 26. Laser 24 generates a continuous wave optical signal at a first wavelength $\lambda_1$. Modulator 26 is a conventional external lithium niobate modulator that intensity modulates data onto a continuous wave signal that is output from laser 24. Modulator 26 utilizes a conventional modulation technique such as amplitude shift keying (ASK). The modulated data signal that is output from modulator 26 (hereafter referred to as the "pump signal") is injected via waveguide 28 into optical coupler 16 of wavelength shifter 10. Although data signal generator 21 has been described in the context of a laser and modulator pair, one skilled in the art will readily appreciate that a wavelength shifter realized in accordance with the principles of the present invention can operate using data signals from any optical data source that provides data signals of suitable signal strength. For example, wavelength shifter 10 can operate using data signals received from LAN 1 of FIG. 1.

Continuous wave generator 15 generates a continuous wave optical signal (hereafter referred to as the "probe signal") to which data from the pump signal will be transferred. Continuous wave generator 15 generates the probe signal at the wavelength $\lambda_2$ to which a representation of the data is to be impressed. The wavelength of the probe signal can be either longer or shorter than the wavelength of the pump signal. The probe signal has a weaker signal strength (i.e., optical power) than the pump signal.

Continuous wave generator 15 preferably comprises a laser that is tunable over a range of wavelengths. Although continuous wave generator 15 is shown in FIG. 2 as being an integral part of wavelength shifter 10, it is within the scope of this invention for wavelength shifter 10 to receive continuous wave signals from an external device.

Optical coupler 16 receives the pump and probe signals on waveguides 28 and 30, respectively, and outputs the combined optical signal to traveling wave amplifier 18. Optical coupler 16 illustratively is a 10:1 coupler that transfers 90 percent of the optical power of the pump signal and 10 percent of the optical power of the probe signal to traveling wave amplifier 18. Optical coupler 16 can be configured to provide the remaining pump signal optical power to a receiver for comparison with and error checking of the probe signal that is output from filter means 20.

Figure 3:
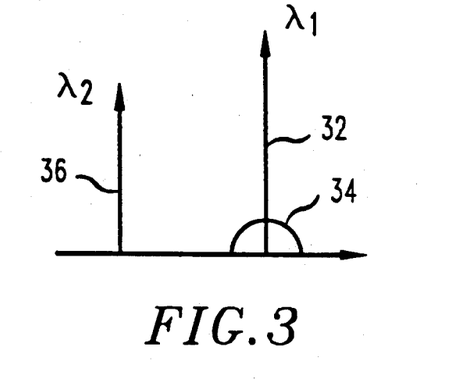
FIGS. 3 and 4 are illustrative power spectra of the optical signals at various points along the wavelength shifter of FIG. 2.

FIG. 3 shows the power spectra of the combined pump and probe signals output from optical coupler 16. The pump signal, designated by reference number 32, is modulated with data that is represented by reference number 34. Pump signal 32 has a wavelength $\lambda_1$. The probe signal, designated by reference number 36, is a continuous wave signal at wavelength $\lambda_2$. Pump signal 32 is a stronger signal than probe signal 36. For example, an illustrative pump signal has an average signal strength of $-2$ dBm. A corresponding probe signal typically may have a signal strength of $-10$ dBm. Both the pump signal and the probe signal illustratively have wavelengths in the 1.5 $\mu$m range, though other wavelengths can be used.

Figure 4:
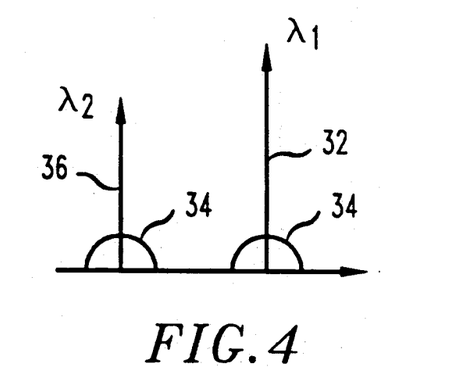

As shown in FIG. 4, traveling wave amplifier 18 impresses a representation of data 34 from pump signal 32 at wavelength $\lambda_1$ onto the on continuous wave probe signal 36 at wavelength $\lambda_2$. Traveling wave amplifier 18 operates to pass optical signals without reflection, thus eliminating the resonance that occurs in standing wave or multi-pass devices, such as Fabry-Perot amplifiers. Traveling wave amplifier 18 can generate the representation of data 34 at significantly higher rates than can be achieved with a standing wave device. Moreover, unlike a Fabry-Perot amplifier, the tuning capability of traveling wave amplifier 18 is not limited to Fabry-Perot resonance peaks. Instead, the traveling wave amplifier enables a wavelength shifter realized in accordance with the principles of the present invention to be fully tunable within the operating bandwidth.

Traveling wave amplifier 18 illustratively is a conventional bulk semiconductor optical amplifier. Variations in the envelope of the pump signal at wavelength $\lambda_1$ are impressed on the probe signal at wavelength $\lambda_2$ as a result of the gain saturation effect that occurs in a semiconductor optical amplifier. More specifically, the signal power of the pump signal is sufficient to compress by several dB the small-signal gain of the semiconductor optical amplifier that is seen by the weaker probe signal. In this manner, a representation of data, in complementary form, is impressed on the probe signal.

Figure 5:
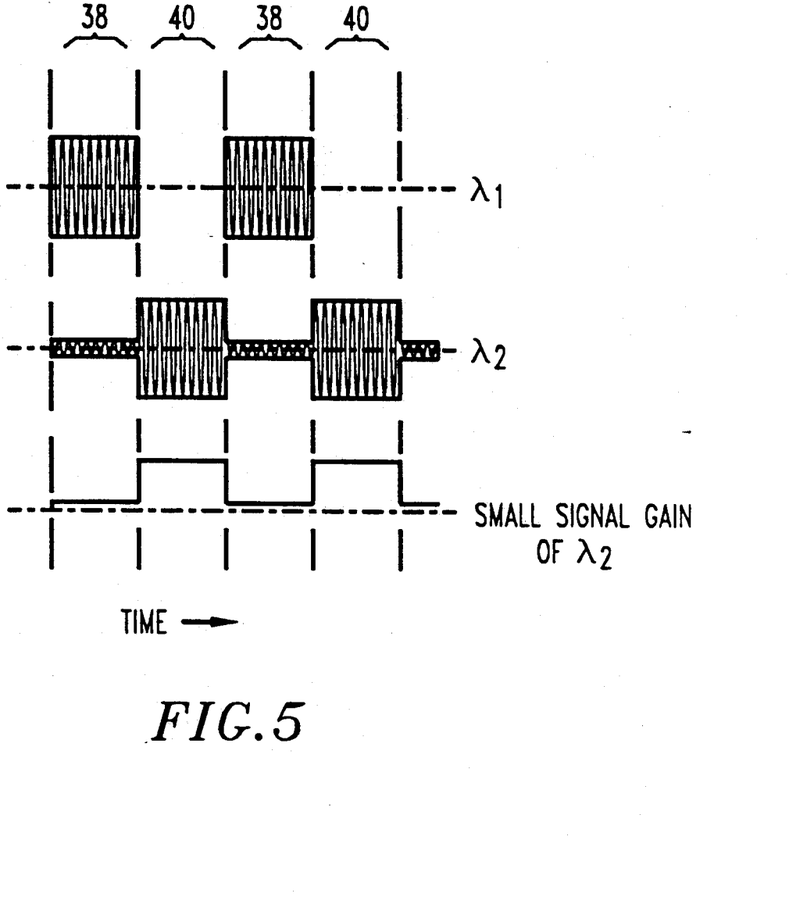
FIG. 5 is an illustrative waveform of the data content of the first and second optical signals output from the traveling wave amplifier of FIG. 2.

FIG. 5 shows the effect of the optical power of the pump signal on the gain of traveling wave amplifier 18 as seen by the probe signal. Traveling wave amplifier 18 amplifies both the pump and the probe signals, but the gain as seen by the probe signal depends upon the current value of the pump signal power. Thus, when the data on the pump signal is high, e.g., logic one, the amplifier gain seen by the probe signal is compressed. Gain compression results because the stronger pump signal depletes the carriers in the amplifier that are available to the weaker, continuous wave probe signal. As shown by reference number 38, this greatly reduces the small-signal gain seen by the probe signal. Conversely, when the data on the pump signal is low, e.g., logic zero, the probe signal is amplified to the full gain of the amplifier, as shown by reference number 40.

The gain-saturation effect has the advantage of producing a large extinction ratio of the output probe signal to the input pump power, thus minimizing degradation of the optical data.

As mentioned above, traveling wave amplifier 18 amplifies not only the pump signal, but amplifies the probe signal as well. For example, for input pump and probe signal powers of −2 dBm and −10 dBm, respectively, traveling wave amplifier 18 outputs the probe signal with an average signal strength of 0 dBm. Thus, the representation of the data that has been impressed on the probe signal at the desired wavelength has a greater average signal strength (0 dBm) than the original input pump data signal (−2 dBm). This feature, referred to herein as "conversion gain," makes the wavelength shifter of the present invention well-suited for applications in which one or more wavelength shifters are to be cascaded. An example of cascaded wavelength shifters will be described below.

Referring again to FIG. 2, filter means 20 receives the amplified pump and probe signals from traveling wave amplifier 18. Filter means 20 extracts the probe signal from the pump signal and outputs the probe signal to external circuitry, such as optical demultiplexer 14 of FIG. 1. Filter means 20 can be implemented using any suitable means. An example of a suitable filtering means is a fiber Fabry-Perot filter as described by J. Stone, "Optical-Fibre Fabry-Perot Interferometer with a Finesse of 300," Elect. Letters, Vol. 21, No. 11, May 1985. As described in greater detail below, filter means 20 alternatively can be implemented using a polarization beam splitter.

In an exemplary embodiment of the invention, the pump and probe signals have different—and preferably orthogonal—polarizations. The pump signal is an optical signal aligned along the TM mode of traveling wave amplifier 18. The probe signal is an optical signal aligned along the TE mode of traveling wave amplifier 18. In this embodiment, filter means 20 is implemented as a polarization beam splitter to separate the probe signal from the pump signal. Because the polarizations of the pump and probe signals are orthogonal to each other, the probe signal can be separated from the pump signal independently of the pump wavelength.

Wavelength shifters realized in accordance with the principles of the present invention are capable of impressing representations of data from a single pump signal simultaneously onto a plurality of probe signals. To achieve this, a plurality of continuous wave probe signals, each at a different wavelength, are combined with a single pump signal and are input to traveling wave amplifier 18. The pump signal and all of the probe signals are amplified simultaneously. The pump signal changes the gain of traveling wave amplifier 18 as seen by all of the probe signals and thereby impresses a representation of the data modulated on the pump signal onto each of the probe signals. This capability of the wavelength shifter is useful when multicasting data from a single data source to several receivers. For example, in FIG. 1, transmitter $T_1$ of LAN 1 can simultaneously transmit the same data to receivers $R_1$ and $R_n$ of LAN 2 via wavelength shifter 10. Wavelength shifter 10 includes a plurality of continuous wave generators (not shown), specifically, one for each probe signal. The probe signal strength preferably is decreased when multicasting several probe signals to ensure small signal operation in traveling wave amplifier 18.

Figure 6:
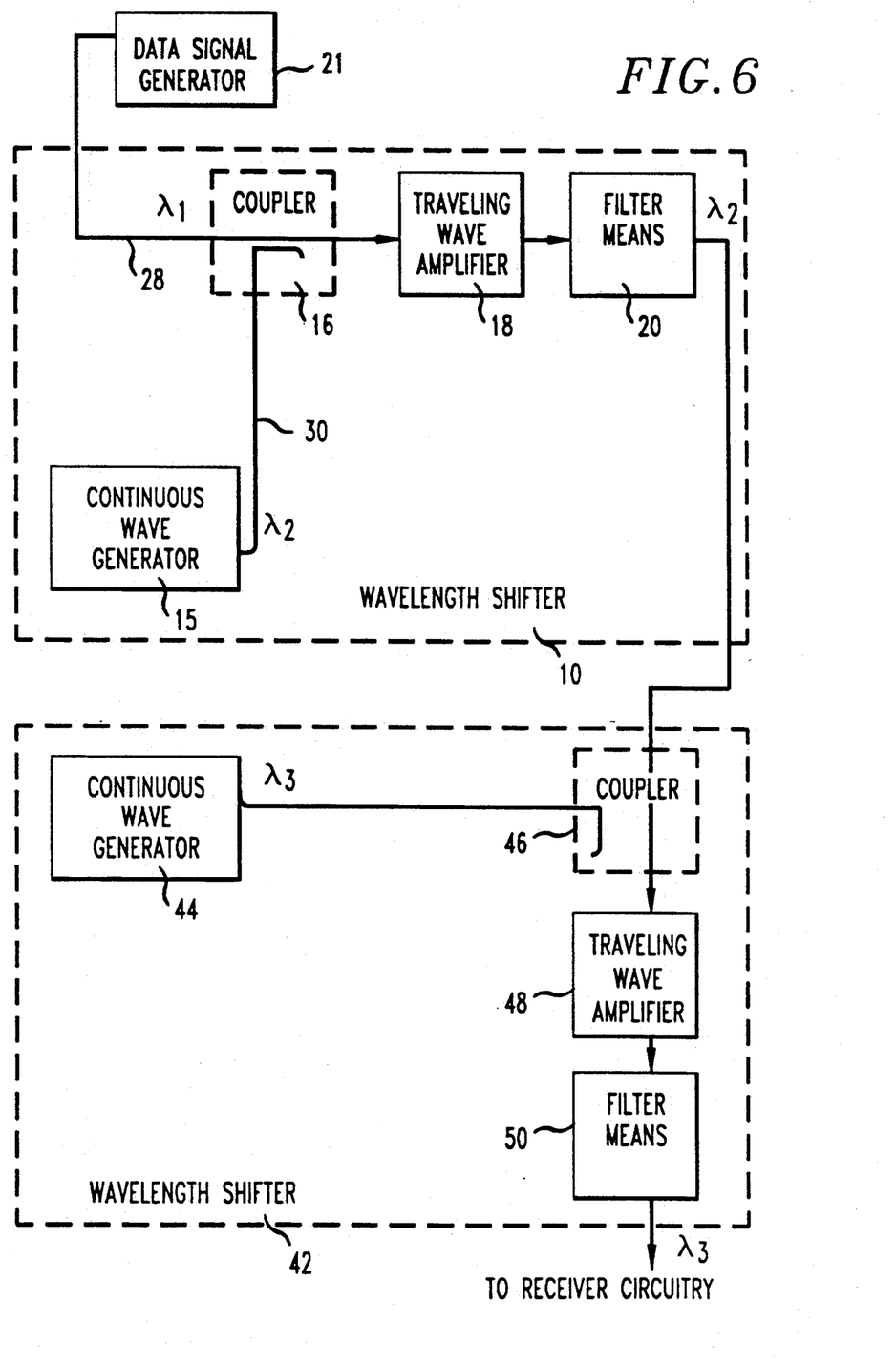
FIG. 6 is a block diagram of two cascaded wavelength shifters realized in accordance with the principles of the present invention.

As discussed briefly above, wavelength shifters realized in accordance with the principles of the present invention are cascadable. FIG. 6 shows an illustrative embodiment of cascaded wavelength shifters. The cascaded wavelength shifters include wavelength shifters 10 and 42. Wavelength shifter 10 has been described in detail above with respect to FIG. 2. Wavelength shifter 42 includes a continuous wave generator 44, an optical coupler 46, a traveling wave semiconductor optical amplifier 48, and a filter means 50. Several wavelength shifters can be cascaded because each wavelength shifter provides conversion gain and does not significantly degrade the optical data signal.

Wavelength shifter 10 receives a pump signal of wavelength $\lambda_1$ from data signal generator 12 and impresses a representation of the data from that pump signal to the probe signal at wavelength $\lambda_2$ generated by continuous wave generator 15. The probe signal output from wavelength shifter 10, in turn, becomes the pump signal for wavelength shifter 40. Wavelength shifter 40 operates in the manner described with respect to wavelength shifter 10 to impress a representation of the data from the first probe signal at wavelength $\lambda_2$ onto a second probe signal generated at wavelength $\lambda_3$ by continuous wave generator 42. Filter means 50 extracts the second probe signal from the output of traveling wave amplifier 48.

As described above, wavelength shifter 10 provides conversion gain to the optical signal that it outputs to wavelength shifter 42. However, additional amplification may be provided between wavelength shifters 10 and 42 to boost optical signals passing between the wavelength shifters. Such amplification can be provided, for example, by an erbium-doped fiber amplifier and suitable filter means for removing distortion introduced by the amplifier.

Thus far, the invention has been described illustratively in the context of a wavelength shifter in which the pump and probe signals co-propagate, that is, travel in the same direction, through traveling wave amplifier 18. However, as described below, it is within the scope of the invention to realize a wavelength shifter in which the pump and probe signals cross-propagate (i.e., travel in opposite directions) through traveling wave amplifier 18. Cross-propagation of the pump and probe signals eliminates the need to filter the probe signal from the pump signal because the pump and probe signals exit the traveling wave amplifier from different optical ports of the amplifier.

Figure 7:
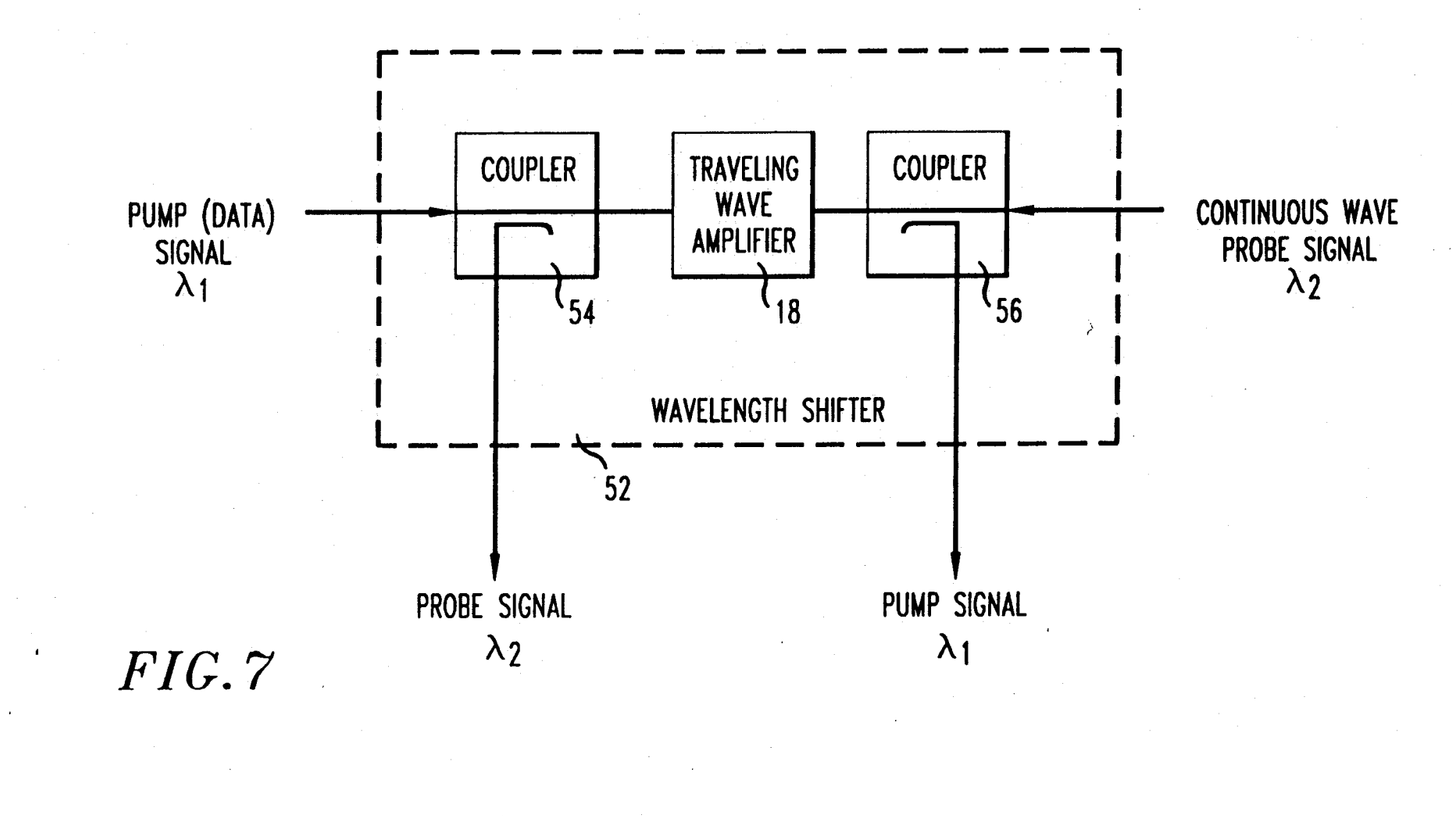
FIG. 7 is a block diagram of an alternative embodiment of a wavelength shifter realized in accordance with the principles of the present invention.

As shown in FIG. 7, a cross-propagation wavelength shifter 52 illustratively is implemented by inputting a modulated pump signal through a first wavelength-selective optical coupler 54 to a first optical port of traveling wave amplifier 18 and inputting a continuous wave probe signal through a second wavelength-selective optical coupler 56 to a second optical port of the traveling wave amplifier. A representation of the data modulated on the pump signal is impressed onto the probe signal as the pump and probe signals cross-propagate through the amplifier. The probe signal, impressed with a representation of the data, is output to coupler 54. The pump signal is output to coupler 56.

It will be understood that the foregoing is merely illustrative of the principles of the invention, and that various modifications can be made by those skilled in the art without departing from the scope and spirit of the invention. For example, various combinations of pump and probe signal powers can be used with optical couplers having different crossover ratios to achieve the desired data duplication characteristics.

I claim:

1. Apparatus for impressing a representation of variations in an envelope of a first optical signal having a first wavelength onto a continuous wave optical signal having a second wavelength, the apparatus comprising:

a traveling wave semiconductor optical amplifier having gain, the traveling wave semiconductor optical amplifier receiving and amplifying the first and continuous wave optical signals, and wherein the first optical signal affects the gain of the traveling wave amplifier as seen by the continuous wave optical signal so as to impress a representation of variations in the envelope of the first optical signal onto the continuous wave optical signal; and means for coupling the first and continuous wave optical signals, the coupling means having means for receiving the first and continuous wave optical signals and having an output for outputting the combined first and continuous wave optical signals to the traveling wave semiconductor optical amplifier.

2. The apparatus as defined in claim 1 wherein the variations in the envelope of the first optical signal comprise data.

3. The apparatus as defined in claim 1 wherein the representation of the variations in the envelope is substantially the complement of the variations in the envelope of the first optical signal.

4. The apparatus as defined in claim 1 further comprising means for generating the continuous wave optical signal.

5. The apparatus as defined in claim 4 wherein the generating means comprises a laser tunable within a predetermined bandwidth.

6. The apparatus as defined in claim 4 further comprising:

means for generating a second continuous wave optical signal at a wavelength other than the first and second wavelengths; and means for coupling the second continuous wave optical signal with the first optical signal and the first continuous wave optical signal so that the first optical signal and the first and second continuous wave optical signals are input simultaneously to the traveling wave semiconductor optical amplifier, wherein the first optical signal affects the gain of the travelling wave amplifier as seen by the first and second continuous wave optical signals so as to impress a representation of variations in the envelope of the first optical signal onto the first and second continuous wave optical signals.

7. The apparatus as defined in claim 1 wherein the first wavelength is longer than the second wavelength.

8. The apparatus as defined in claim 1 wherein the first wavelength is shorter than the second wavelength.

9. The apparatus as defined in claim 1 further comprising means for separating the continuous wave optical signal from the first optical signal, the separating means receiving the first and continuous wave optical signals from the traveling wave semiconductor optical amplifier.

10. The apparatus as defined in claim 1 wherein the first and continuous wave optical signals have different polarizations, and the apparatus further comprises a polarization beam splitter for separating the first and continuous wave optical signals after the first and continuous wave optical signals pass through the traveling wave semiconductor optical amplifier.

11. The apparatus as defined in claim 1 further comprising:

means for recovering from the traveling wave semiconductor optical amplifier the continuous wave optical signal impressed with the representation of variations in the envelope;

a second traveling wave semiconductor optical amplifier having gain, the second traveling wave semiconductor optical amplifier receiving and amplifying the recovered optical signal and a second continuous wave optical signal, and wherein the recovered optical signal affects the gain of the traveling wave amplifier as seen by the second continuous wave optical signal so as to impress a representation of variations in the envelope of the recovered optical signal onto the second continuous wave optical signal.

12. The apparatus as defined in claim 1 wherein the first and continuous wave optical signals co-propagate through the traveling wave semiconductor optical amplifier.

13. The apparatus as defined in claim 1 wherein the first and continuous wave optical signals cross-propagate through the traveling wave semiconductor optical amplifier.

14. A method for impressing a representation of variations in an envelope of a first optical signal having a first wavelength onto a continuous wave optical signal having a second wavelength, the method comprising the steps of:

applying the first optical signal to a traveling wave semiconductor optical amplifier having gain; and applying the continuous wave optical signal to the traveling wave semiconductor optical amplifier, wherein the traveling wave semiconductor optical amplifier receives and amplifies the first and continuous wave optical signals, and wherein the first optical signal affects the gain of the traveling wave amplifier as seen by the continuous wave optical signal so as to impress a representation of variations in the envelope of the first optical signal onto the continuous wave optical signal.

15. The method as defined in claim 14 wherein the first wavelength is longer than the second wavelength.

16. The method as defined in claim 14 wherein the first wavelength is shorter than the second wavelength.

17. The method as defined in claim 14 wherein the first and continuous wave optical signals co-propagate through the traveling wave semiconductor optical amplifier, the method further comprising the step of separating the first and continuous wave optical signals after the first and continuous wave optical signals co-propagate through the traveling wave semiconductor optical amplifier.

18. The method as defined in claim 14 wherein the first and continuous wave optical signals cross-propagate through the traveling wave semiconductor optical amplifier.

19. The method as defined in claim 14 wherein the first and continuous wave optical signals have different polarizations, and the method further comprises the step of passing the first and continuous wave optical signals through a polarization beam splitter to separate the first and continuous wave optical signals after the first and continuous wave optical signals pass through the traveling wave simiconductor optical amplifier.

20. The method as defined in claim 14 further comprising the step of:
applying a second continuous wave optical signal to the traveling wave semiconductor optical amplifier so that the traveling wave semiconductor optical amplifier receives and amplifies the first optical signal and the second continuous wave optical signal simultaneously, and wherein the first optical signal affects the gain of the traveling wave amplifier as seen by the second continuous wave optical signal so as to impress a representation of variations in the envelope of the first optical signal onto the second continuous wave optical signal.

21. The method as defined in claim 14 further comprising the steps of:
recovering the continuous wave optical signal after it passes through the traveling wave semiconductor optical amplifier;
applying a second continuous wave optical signal to a second traveling wave semiconductor optical amplifier, the second continuous wave optical signal having a third wavelength that is different than the first and second wavelengths; and
applying the recovered optical signal to the second traveling wave semiconductor optical amplifier such that the recovered optical signal affects the gain of the traveling wave amplifier as seen by the second continuous wave optical signal so as to impress a representation of variations in the envelope of the recovered optical signal onto the second continuous wave optical signal.

22. Apparatus for impressing a representation of variations in an envelope of a first optical signal having a first wavelength onto a continuous wave optical signal having a second wavelength, the apparatus comprising:
a traveling wave semiconductor optical amplifier having gain, the traveling wave semiconductor optical amplifier receiving and amplifying the first and continuous wave optical signals, and wherein the gain of the traveling wave amplifier is variably controlled by the first optical signal thereby causing the travelling wave amplifier to impress a representation of variations in the envelope of the first optical signal onto the continuous wave optical signal; and
means for coupling the first and continuous wave optical signals, the coupling means having means for receiving the first and continuous wave optical signals and having an output for outputting the combined first and continuous wave optical signals to the traveling wave semiconductor optical amplifier.

* * * * *